United States Patent
Stelzer et al.

(10) Patent No.: US 11,664,811 B2
(45) Date of Patent: *May 30, 2023

(54) MECHANICAL SHOCK DETECTION AND PHASE AND FREQUENCY CORRECTION OF A MEMS MIRROR

(71) Applicant: Infineon Technologies AG, Neubiberg (DE)

(72) Inventors: Philipp Stelzer, Graz (AT); Norbert Druml, Graz (AT); Christian Steger, Graz (AT); Andreas Strasser, Graz (AT)

(73) Assignee: Infineon Technologies AG, Neubiberg (DE)

( * ) Notice: Subject to any disclaimer, the term of this patent is extended or adjusted under 35 U.S.C. 154(b) by 352 days.

This patent is subject to a terminal disclaimer.

(21) Appl. No.: 16/996,109

(22) Filed: Aug. 18, 2020

(65) Prior Publication Data

US 2020/0403626 A1 Dec. 24, 2020

Related U.S. Application Data

(63) Continuation of application No. 16/449,646, filed on Jun. 24, 2019, now Pat. No. 10,840,922.

(51) Int. Cl.
| | |
|---|---|
| *G01C 3/08* | (2006.01) |
| *H03L 7/099* | (2006.01) |
| *H03L 7/087* | (2006.01) |
| *G02B 26/08* | (2006.01) |
| *G01S 7/4863* | (2020.01) |
| *G01S 7/4865* | (2020.01) |
| *G01S 17/931* | (2020.01) |

(52) U.S. Cl.
CPC .......... *H03L 7/0992* (2013.01); *G01S 7/4863* (2013.01); *G01S 7/4865* (2013.01); *G01S 17/931* (2020.01); *G02B 26/0833* (2013.01); *H03L 7/087* (2013.01)

(58) Field of Classification Search
None
See application file for complete search history.

(56) References Cited

U.S. PATENT DOCUMENTS 7,907,019 B1 * 3/2011 Brown ................. H04N 9/3135
 331/25
2018/0348506 A1 * 12/2018 Duvdevany .......... G02B 26/105

* cited by examiner

*Primary Examiner* — Mark Hellner
(74) *Attorney, Agent, or Firm* — Harrity & Harrity, LLP

(57) ABSTRACT

A system for driving a microelectromechanical system (MEMS) oscillating structure includes a phase error detector configured to generate a phase error signal based on measured event times and expected event times of the MEMS oscillating structure oscillating about a rotation axis; a disturbance event detector configured to detect a disturbance event based on the phase error signal and a disturbance threshold value; and a phase frequency detector (PFD) and correction circuit configured to, in response to the detected disturbance event, monitor for a plurality of measured crossing events of the MEMS oscillating structure oscillating about the rotation axis, generate a first compensation signal based on at least a first measured crossing event and a second measured crossing event to correct a frequency of the MEMS oscillating structure, and generate a second compensation signal based on a third measured crossing event to correct a phase of the MEMS oscillating structure.

19 Claims, 5 Drawing Sheets

MECHANICAL SHOCK DETECTION AND PHASE AND FREQUENCY CORRECTION OF A MEMS MIRROR

CROSS-REFERENCE TO RELATED APPLICATIONS

This application is a continuation of U.S. patent application Ser. No. 16/449,646 filed Jun. 24, 2019, which is incorporated by reference as if fully set forth.

FIELD

The present disclosure relates generally to a microelectromechanical system (MEMS) oscillating system and method for operating the same, and, more particularly, to correcting a phase and a frequency of a MEMS mirror subsequent to detecting a mechanical shock or other disturbance event.

BACKGROUND

Light Detection and Ranging (LIDAR), is a remote sensing method that uses light in the form of a pulsed laser to measure ranges (variable distances) to one or more objects in a field of view. In particular, a microelectromechanical system (MEMS) mirror is used to scan light across the field of view. Arrays of photodetectors receive reflections from objects illuminated by the light, and the time it takes for the reflections to arrive at various sensors in the photodetector array is determined. This is also referred to as measuring time-of-flight (TOF). LIDAR systems form depth measurements and make distance measurements by mapping the distance to objects based on the time-of-flight computations. Thus, the time-of-flight computations can create distance and depth maps, which may be used to generate images.

LIDAR will be a key enabler for self-driving cars. Therefore, it is mandatory that the obtained data from a LIDAR system is reliable. To obtain correct LIDAR data, it is essential that a PLL of a MEMS driver circuit is stable. However, MEMS mirrors operated at a certain resonance frequency may be impacted by large mechanical shocks. For example, in the event of a large mechanical shock to the MEMS mirror, the MEMS mirror can become unstable to the point that the PLL is unable to detect further zero crossing events used to control and stabilized the MEMS mirror. Current LIDAR systems can only recover the operational capability of the MEMS mirror by stopping and restarting the system anew. Thus, a recovery during runtime (i.e., while maintaining operation of the MEMS mirror) without stopping the MEMS mirror is not possible.

Therefore, an improved device capable of detecting mechanical shock events and correcting the phase and the frequency of a MEMS mirror after an occurrence of such events may be desirable.

SUMMARY

Embodiments provide a microelectromechanical system (MEMS) oscillating system and method for operating the same, and, more particularly, to correcting a phase and a frequency of a MEMS mirror subsequent to detecting a mechanical shock.

One or more embodiments provide a system for driving a microelectromechanical system (MEMS) oscillating structure. The system includes a MEMS oscillating structure configured to oscillate about a rotation axis; a phase error detector configured to generate a phase error signal based on measured event times and expected event times of the MEMS oscillating structure oscillating about the rotation axis; a disturbance event detector configured to detect a disturbance event based on the phase error signal and a disturbance threshold value, wherein the disturbance event disrupts an oscillation of the MEMS oscillating structure such that the phase error signal exceeds the disturbance threshold value; and a phase frequency detector (PFD) and correction circuit configured to, in response to the detected disturbance event, monitor for a plurality of measured crossing events of the MEMS oscillating structure oscillating about the rotation axis, generate a first compensation signal based on at least a first measured crossing event and a second measured crossing event of the plurality of measured crossing events to correct a frequency of the MEMS oscillating structure, and generate a second compensation signal based on a third measured crossing event of the plurality of measured crossing events to correct a phase of the MEMS oscillating structure.

One or more embodiments provide method of compensating a microelectromechanical system (MEMS) oscillating structure. The method includes driving the MEMS oscillating structure configured to oscillate about a rotation axis; generating a phase error signal based on measured event times and expected event times of the MEMS oscillating structure oscillating about the rotation axis; and detecting a disturbance event based on the phase error signal and a disturbance threshold value, wherein the disturbance event disrupts an oscillation of the MEMS oscillating structure such that the phase error signal exceeds the disturbance threshold value. The method further includes, in response to the detected disturbance event, monitoring for a plurality of measured crossing events of the MEMS oscillating structure oscillating about the rotation axis; generating a first compensation signal based on at least a first measured crossing event and a second measured crossing event of the plurality of measured crossing events to correct a frequency of the MEMS oscillating structure; and generating a second compensation signal based on a third measured crossing event of the plurality of measured crossing events to correct a phase of the MEMS oscillating structure.

BRIEF DESCRIPTION OF THE DRAWINGS

Embodiments are described herein making reference to the appended drawings.

DETAILED DESCRIPTION

Figure 1:
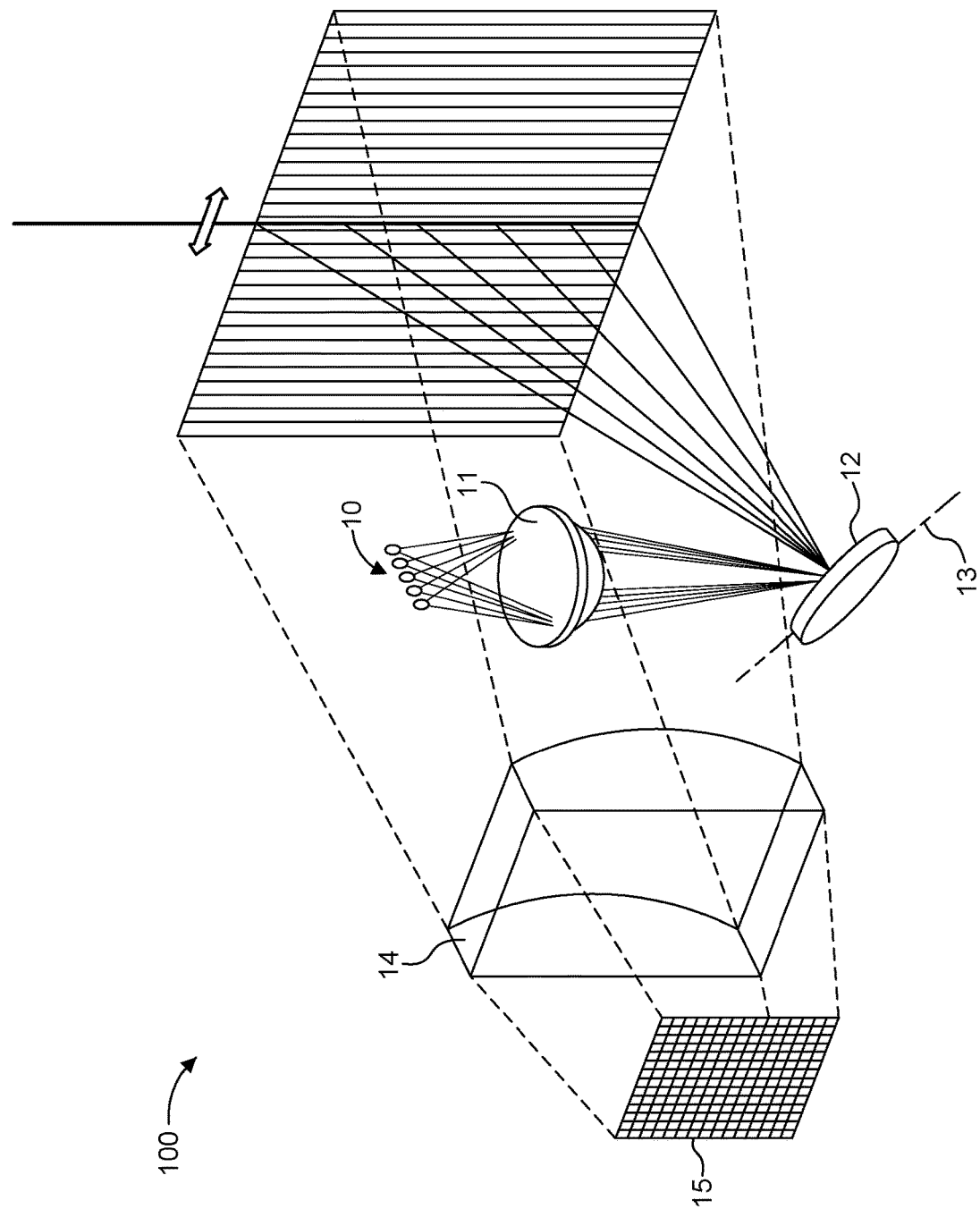
FIG. 1 is a schematic diagram of a LIDAR scanning system 100 in accordance with one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photos of light coming from a lens into voltages. The larger the active area of the sensor, the more light that can be collected to create an image.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

In Light Detection and Ranging (LIDAR) systems, a light source transmits light pulses into a field of view and the light reflects from one or more objects by backscattering. In particular, LIDAR is a direct Time-of-Flight (TOF) system in which the light pulses (e.g., laser beams of infrared light) are emitted into the field of view, and a pixel array detects and measures the reflected beams. For example, an array of photodetectors receives reflections from objects illuminated by the light.

Currently, a photodetector array may be used to measure the reflected light. The photodetector array may be a one-dimensional (1D) array that consists of multiple rows of photodetectors (pixels) arranged in a single column or a two-dimensional (2D) array that consists of multiple rows and columns of photodetectors arranged in a grid-like arrangement. Each pixel row or group of adjacent pixel rows may be readout as a measurement signal in the form of raw analog data. Each measurement signal may include data from a single pixel column or from two or more pixel columns corresponding to the selected pixel row or rows.

Differences in return times for each light pulse across multiple pixels of the pixel array can then be used to make digital 3D representations of an environment or to generate other sensor data. For example, the light source may emit a single light pulse, and a time-to-digital converter (TDC) electrically coupled to the pixel array may count from the time the light pulse is emitted, corresponding to a start signal, until a time the reflected light pulse is received at the receiver (i.e., at the pixel array), corresponding to a stop signal. The "time-of-flight" of the light pulse is then translated into a distance. In another example, an analog-to-digital converter (ADC) may be electrically coupled to the pixel array (e.g., indirectly coupled with intervening elements in-between) for pulse detection and TOF measurement. For example, an ADC may be used to estimate a time interval between start/stop signals with an appropriate algorithm.

A scan such as an oscillating horizontal scan (e.g., from left to right and right to left of a field of view) can illuminate a scene in a continuous scan fashion. Each firing of the laser beam by the light sources can result in a scan line in the "field of view." By emitting successive light pulses in different scanning directions, an area referred to as the field of view can be scanned and objects within the area can be detected and imaged. Thus, the field of view represents a scanning plane having a center of projection. A raster scan could also be used.

FIG. 1 is a schematic diagram of a LIDAR scanning system 100 in accordance with one or more embodiments. The LIDAR scanning system 100 is an optical scanning device that includes a transmitter, including an illumination unit 10, a transmitter optics 11, and a one-dimensional (1D) MEMS mirror 12 (1D MEMS scanner), and a receiver, including a primary optics 14, and an optical receiver 15. The optical receiver 15 in the illustration is a 2D photodetector array 15 but may alternatively be a 1D photodetector array. The receiver may further include receiver circuitry, such as data acquisition/readout circuitry and data processing circuitry, as will be further described according to FIG. 2.

While this arrangement represents one example arrangement of a LIDAR system, it will be appreciated that the 1D scanning mirror 12 may be rotated to scan in a different scanning direction. For example, the LIDAR scanning system 100 may be rotated 90° to scan in the vertical direction instead of the horizontal direction.

The illumination unit 10 includes multiple light sources (e.g., laser diodes or light emitting diodes) that are linearly aligned in single bar formation and are configured to transmit light used for scanning an object. The light emitted by the light sources is typically infrared light although light with another wavelength might also be used. As can be seen in the embodiment of FIG. 1, the shape of the light emitted by the light sources is spread in a direction perpendicular to the transmission direction to form a light beam with an oblong shape perpendicular to a transmission. The illumination light transmitted from the light sources are directed towards the transmitter optics 11 configured to focus each laser onto a one-dimensional MEMS mirror 12.

The transmitter optics 11 may be, for example, a lens or a prism. When reflected by the MEMS mirror 12, the light from the light sources are aligned vertically to form a one-dimensional vertical scanning line of infrared light or a vertical bar of infrared light. Each light source of the illumination unit 10 contributes to a different vertical region of the vertical scanning line. While five laser sources are shown, it will be appreciated that the number of laser sources are not limited thereto. For example, the vertical scanning line may be generated by a single laser source, two laser sources, and so on. It will also be appreciated that the light sources may be arranged in a matrix formation.

The MEMS mirror 12 is a mechanical moving mirror (i.e., a MEMS micro-mirror) integrated on a semiconductor chip (not shown). The MEMS mirror 12 according to this embodiment is configured to rotate about a single scanning axis and can be said to have only one degree of freedom for scanning. Distinguished from 2D-MEMS mirrors (2D MEMS scanners), in the 1D MEMS mirror, the single scanning axis is fixed to a non-rotating substrate and therefore maintains its spatial orientation during the oscillation of the MEMS mirror. Due to this single scanning axis of rotation, the MEMS mirror 12 is referred to as a 1D MEMS mirror or 1D MEMS scanner.

The MEMS mirror 12 is configured to oscillate "side-to-side" about a single scanning axis 13 such that the light reflected from the MEMS mirror 12 (i.e., the vertical scanning line of light) oscillates back and forth in a horizontal scanning direction. A scanning period or an oscillation period is defined, for example, by one complete oscillation from a first edge of the field of view (e.g., left side) to a second edge of the field of view (e.g., right side) and then back again to the first edge. A mirror period of the MEMS mirror 12 corresponds to a scanning period.

Thus, the field of view is scanned in the horizontal direction by the vertical bar of light by changing the angle of the MEMS mirror 12 on its scanning axis 13. For example, the MEMS mirror 12 may be configured to oscillate between +/−15 degrees in a horizontal scanning direction to steer the light over +/−30 degrees (i.e., 60 degrees) making up the horizontal scanning range of the field of view. Thus, the field of view may be scanned, line-by-line, by a rotation of the MEMS mirror 12 though its degree of motion. One such sequence though the degree of motion (e.g., from −15 degrees to +15 degrees or vice versa) is referred to as a single scan. Thus, two scans are used for each scanning period. Multiple scans may be used to generate distance and depth maps, as well as 3D images by a processing unit. The horizontal resolution of the depth maps and images depends on the size of the incremental steps in rotation angle of the MEMS mirror 12 taken between scans.

While the transmission mirror is described in the context of a MEMS mirror, it will be appreciated that other 1D mirrors or even 2D mirrors can also be used. In addition, the degree of rotation is not limited to +/−15 degrees, and the field of view may be increased or decreased according to the application. Thus, a one-dimensional scanning mirror is configured to oscillate about a single scanning axis and direct the laser beams at different directions into a field of view. Hence, a transmission technique includes transmitting the beams of light into the field of view from a transmission mirror that oscillates about a single scanning axis such that the beams of light are projected as a vertical scanning line into the field of view that moves horizontally across the field of view as the transmission mirror oscillates about the single scanning axis.

LIDAR systems using 1D-scanning mirrors can use a more relaxed shot-rate of the illumination unit 10 (i.e., transmitter) compared to 2D-scanning mirrors which use laser points for scanning the field of view which requires more shots for the transmitter to scan a field of view. In addition, LIDAR systems using 1D-scanning mirrors are typically more robust against shock and vibrations when compared to 2D-scanning mirrors and are therefore better suited for automotive applications.

Upon impinging one or more objects, the transmitted bar of vertical light is reflected by backscattering back towards the LIDAR scanning system 100 as a reflected vertical line where the second optical component 14 (e.g., a lens or prism) receives the reflected light. The second optical component 14 directs the reflected light onto the photodetector array 15 that receives the reflected light as a receiving line RL and is configured to generate electrical measurement signals. The electrical measurement signals may be used for generating a 3D map of the environment and/or other object data based on the reflected light (e.g., via TOF calculations and processing).

The photodetector array 15 can be any of a number of photodetector types; including avalanche photodiodes (APD), photocells, and/or other photodiode devices. Imaging sensors such as charge-coupled devices (CCDs) can be the photodetectors. In the examples provided herein, the photodetector array 15 is a two-dimensional (2D) APD array that comprises an array of APD pixels. In other embodiments, the photodetector array 15 may be a 1D array that includes a single column of photodiodes. The activation of the photodiodes may be synchronized with light pulses emitted by the illumination unit 10.

The photodetector array 15 receives reflective light pulses as a receiving line and generates electrical signals in response thereto. Since the time of transmission of each light pulse from the illumination unit 10 is known, and because the light travels at a known speed, a time-of-flight computation using the electrical signals can determine the distance of objects from the photodetector array 15. A depth map can plot the distance information.

In one example, for each distance sampling, a microcontroller triggers a laser pulse from each of the light sources of the illumination unit 10 and also starts a timer in a Time-to-Digital Converter (TDC) Integrated Circuit (IC). The laser pulse is propagated through the transmission optics, reflected by the target field, and captured by one or more receiving photodiodes of the photodetector array 15. Each receiving photodiode emits a short electrical pulse that is read out by the analog readout circuit. Each signal that is read out of the analog readout circuit may be amplified by an electrical signal amplifier.

A comparator IC recognizes the pulse and sends a digital signal to the TDC to stop the timer. The TDC uses a clock frequency to calibrate each measurement. The TDC sends the serial data of the differential time between the start and stop digital signals to the microcontroller, which filters out any error reads, averages multiple time measurements, and calculates the distance to the target at that particular field position. By emitting successive light pulses in different directions established by the MEMS mirror 12, an area (i.e., a field of view) can be scanned, a three-dimensional image can be generated, and objects within the area can be detected.

The signal processing chain of the receiver may also include an ADC for each photodiode or for a group of photodiodes. The ADC is configured to convert the analog electrical signals from the photodiodes or group of photodiodes into a digital signal that is used for further data processing.

In addition, instead of using the TDC approach, ADCs may be used for signal detection and ToF measurement. For example, each ADC may be used detect an analog electrical signal from one or more photodiodes to estimate a time interval between a start signal (i.e., corresponding to a timing of a transmitted light pulse) and a stop signal (i.e., corresponding to a timing of receiving an analog electrical signal at an ADC) with an appropriate algorithm.

Figure 2:
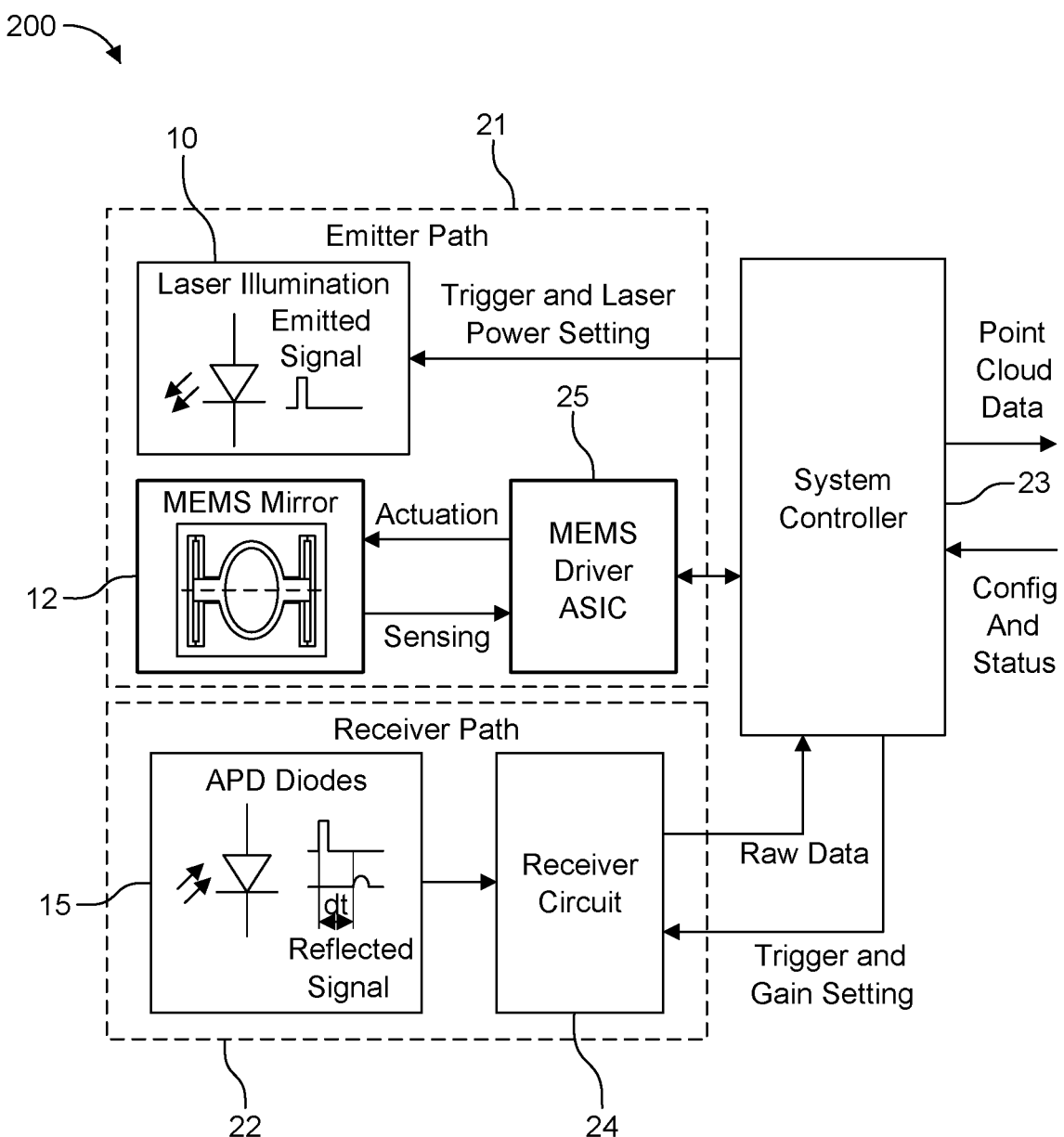
FIG. 2 is a schematic block diagram of the LIDAR scanning system 200 in accordance with one or more embodiments.

FIG. 2 is a schematic block diagram of the LIDAR scanning system 200 in accordance with one or more embodiments. In particular, FIG. 2 shows additional features of the LIDAR scanning system 200, including example processing and control system components such as a MEMS driver ASIC, a receiver circuit, and a system controller.

The LIDAR scanning system 200 includes a transmitter unit 21 that is responsible for an emitter path of the system 200, and a receiver unit 22 that is responsible for a receiver path of the system 200. The system also includes a system controller 23 that is configured to control components of the transmitter unit 21 and the receiver unit 22, and to receive raw data from the receiver unit 22 and perform processing thereon (e.g., via digital signal processing) for generating object data (e.g., point cloud data). Thus, the system controller 23 includes at least one processor and/or processor circuitry for processing data, as well as control circuitry, such as a microcontroller, that is configured to generate control signals.

The receiver unit 22 includes the photodetector array 15 as well as a receiver circuit 24. The receiver circuit 24 may include one or more circuitries or sub-circuitries for receiving and/or processing information. The receiver circuit 24 may receive the analog electrical signals from the APD diodes of the photodetector array 15 and transmit the electrical signals as raw digital data to the system controller 23, for example, after conversion into digital signals via ADCs. Thus, in order to transmit the raw data as digital data, the receiver circuit 24 may include the ADCs and a field programmable gate array (FPGA). The receiver circuit 24 may also receive trigger control signals from the system controller 23 that triggers an activation of one or more APD diodes. The receiver circuit 24 may also receive gain setting control signals for controlling the gain of one or more APD diodes.

The transmitter unit 21 includes the illumination unit 10, the MEMS mirror 12, and a MEMS driver ASIC 25 configured to drive the MEMS mirror 12. In particular, the MEMS driver ASIC 25 actuates and senses the rotation position of the mirror, and provides position information (e.g., degree of rotation about the rotation axis) of the mirror to the system controller 23. Based on this position information, the laser source of the illumination unit 10 is triggered by the system controller and the photodiodes (e.g., APD diodes) are activated to sense, and thus measure, a reflected light signal. Thus, a higher accuracy in position sensing of the MEMS mirror results in a more accurate and precise control of other components of the LIDAR system.

By sensing the rotation position of the MEMS mirror 12 about its rotation axis 13, the MEMS driver ASIC 25 can sense zero-crossing events of the MEMS mirror 12. A zero-crossing event is an instance when the MEMS mirror 12 has a rotation angle of 0° on its rotation axis 13. Specifically, it is the moment when the MEMS mirror 12 is flat. Since the MEMS mirror 12 oscillates back and forth between two rotation directions, a zero-crossing event occurs twice during a scanning period—once as the mirror oscillates in the first rotation direction, and once as the mirror oscillates in the second rotation direction.

In some embodiments, an event time may correspond to a non-zero crossing event. For example, the sensed rotation angle may be some angle other than 0°. However, for the purpose of explanation, examples herein will be described in the context of sensing zero-crossing events.

The MEMS driver ASIC 25 is configured to detect each zero-crossing event and record a timing for each event. This timing information (i.e., measured zero-crossing time) can then be compared by the MEMS driver ASIC 25 with an expected zero-crossing time for each zero-crossing to detect asymmetries in the movement of the MEMS mirror 12 with respect to the two rotation directions. For example, the clockwise pass of the mirror may be faster or slower than the counter-clockwise pass of the mirror due to the asymmetry of the mirror. The MEMS driver ASIC 25 may also send the position information to the system controller 23 so that the system controller 23 can use the position information to control the triggering of the laser pulses of the illumination unit 10 and the activation of the photodiodes of the photodetector array 15.

The MEMS mirror 12 includes an actuator structure used to drive the mirror. The actuator structure includes interdigitated finger electrodes made of interdigitated mirror combs and frame combs to which a driving voltage (e.g., 100V) is applied by the MEMS driver ASIC 25. The driving voltage applied to the finger structure generates a corresponding capacitance. The driving voltage across the finger structure creates a driving force between interdigitated mirror combs and the frame combs, which creates a torque on the mirror body about the rotation axis. The driving voltage can be switched or toggled on and off resulting in an oscillating driving force. The oscillating driving force causes the mirror to oscillate back and forth on its rotation axis between two extrema. As the mirror oscillates, the capacitance between the finger electrodes changes according to the mirror's rotation position. The MEMS driver ASIC 25 is configured to measure the capacitance between the interdigitated finger electrodes, and determine a rotation position or angle position of the MEMS mirror 12 therefrom. By monitoring the capacitance, the MEMS driver ASIC 25 can detect the zero-crossing events and a timing thereof.

As will be described in further detail, the sensing of the position of the MEMS mirror 12 is performed based on a mirror phase error detector that is configured to measure the capacitance. For example, as the MEMS mirror moves, the geometry of the finger structure changes, resulting in a change in the geometry of the capacitance. As the geometry of the capacitance changes, the capacitance itself changes. Thus, a specific capacitance corresponds directly with a specific position (i.e., rotation angle) of the MEMS mirror. By sensing the capacitance of the finger structure, a specific position of the MEMS mirror can be determined.

One way to measure the capacitance is to measure a current flowing through the finger structure, convert the measured current into a voltage, and then further correlate the voltage to a capacitance and/or rotation angle. However, any method to measure the capacitance may be used. A rotation direction (e.g., positive or negative, left-to-right or right-to-left, clockwise or counter-clockwise, etc.) is also detected by measuring a change in capacitance over time, where a positive change or a negative change indicates opposing rotation directions.

Increasing the accuracy of position sensing of the mirror will improve the overall accuracy of the LIDAR system. For example, accuracy requirements may require a laser to be shot within +/−2 millidegrees (i.e., a range of 4 millidegrees) of a vertical target line while the mirror is oscillating at a frequency of, for example, 2 kHz. This translates into an acceptable timing error or error budget of approximately 20 nanoseconds at which the laser must be fired at the mirror to comply with being within +/−2 millidegrees from the target line. Therefore, precisely sensing the position of the mirror is important in order to fulfil this requirement.

Since the mirror is driven at a set oscillation frequency, when the mirror rotates in a first rotation direction (e.g., left-to-right or clockwise), it crosses a zero position (i.e., 0°) at a certain point of time. The same can be said when the mirror rotates in a second rotation direction (e.g., right-to-left or counter-clockwise), the mirror will cross the zero position at a certain point in time. These instances of crossing the zero position may be referred to as zero-crossing events which occur at zero-crossing times.

However, due to variabilities introduced during manufacturing and by aging of the mirror, asymmetries in the mirror may exist and may change over time. These asymmetries cause differences in timing between movement in the first rotation direction compared to movement in the second rotation direction. Said differently, the time interval between two zero-crossings where the later of the two zero crossings is in the first rotation direction may differ from the time interval where the later of the two zero crossings is in the second rotation direction. In addition, one or both zero crossings may deviate from an expected zero-crossing calculated based on the oscillation frequency.

Figure 3:
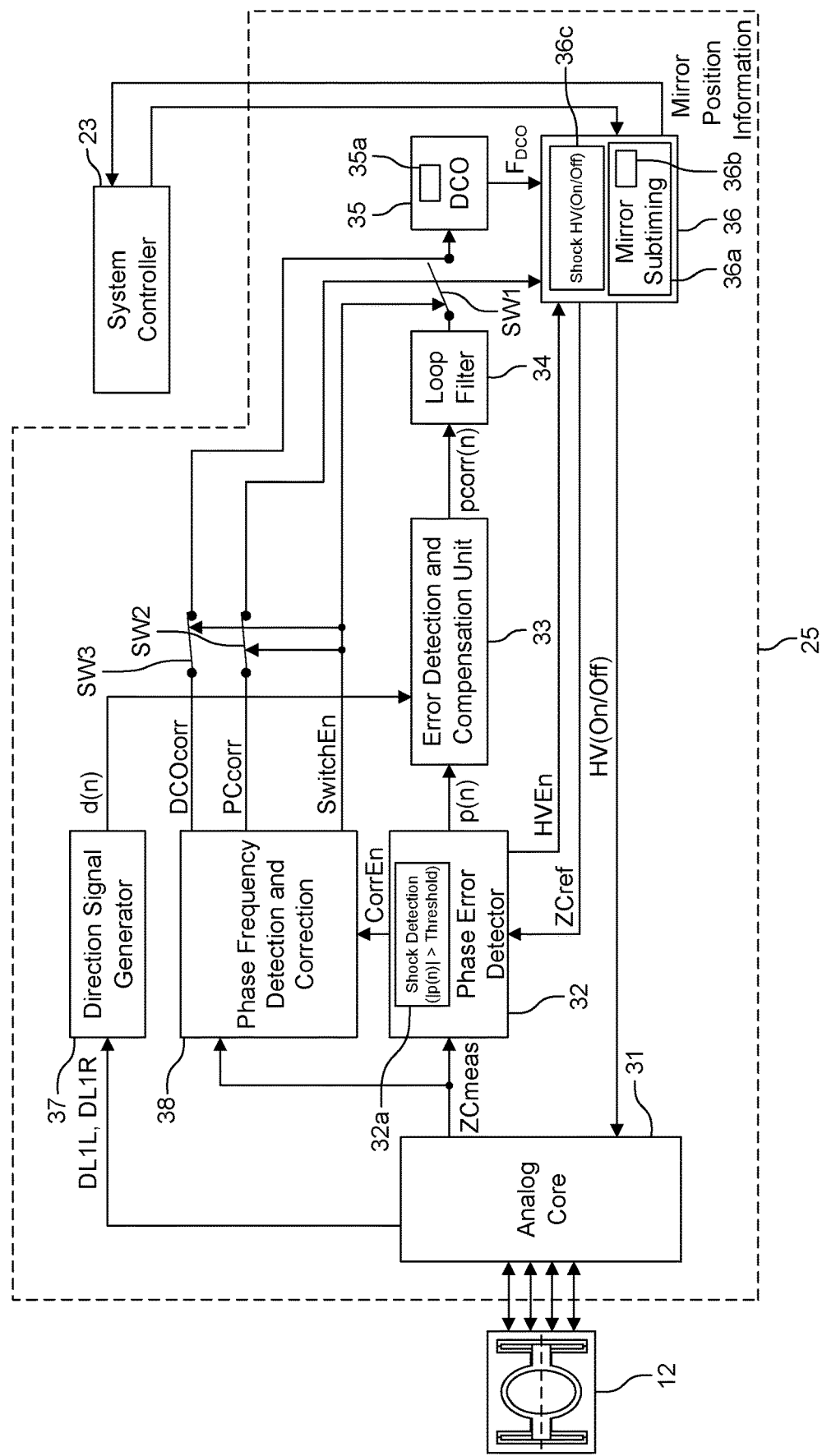
FIG. 3 shows a schematic block diagram of a MEMS driver ASIC according to one or more embodiments.

FIG. 3 shows a schematic block diagram of a MEMS driver ASIC 25 according to one or more embodiments. The MEMS driver ASIC 25 includes an analog core 31, a phase error detector 32 (i.e., a phase detector (PD)), an error detection and compensation unit 33, a loop filter 34, a digitally controlled oscillator (DCO) 35, and a mirror driver 36 arranged in a loop. This loop, together with the MEMS mirror 12, forms a phase-locked loop (PLL) that follows the frequency of the MEMS mirror 12. The MEMS driver ASIC 25 further includes a direction signal generator 37 and a phase frequency detector (PFD) and correction circuit 38. However, it will be appreciated that the direction signal generator 37 and the PFD and correction circuit 38 may also be provided outside of the MEMS driver ASIC 25. The MEMS driver ASIC 25 is in electrical communication with the MEMS mirror 12 and the system controller 23 via electrical connections that are used to transmit signals therebetween.

Thus, the MEMS driver ASIC 25 implements analog circuitry and digital circuitry. The analog circuitry (i.e., the analog core 31) includes one or more inputs and outputs connected to the MEMS mirror 12. For example, one or more inputs of the analog core 31 may receive analog signals from the MEMS mirror 12 related to the position and rotation direction of the mirror. In addition, one or more outputs of the analog core 31 may provide control signals to the MEMS mirror 12 for controlling the oscillation of the mirror.

The analog core 31 includes analog circuitry configured to measure the capacitance of the finger structure of the MEMS mirror actuator in order to measure timing-critical events, such as zero-crossings with the aid of comparators. Thus, the analog circuitry measures a position of the MEMS mirror 12 about a rotation axis and determines zero-crossing times in a first rotation direction and in a second rotation direction. The analog circuitry is also configured to generate direction information DL1L and DL1R related to the direction of rotation (e.g., clockwise or counter-clockwise) of the MEMS mirror 12. The remaining, digital circuitry implements the chip's intelligence (control of mirror, laser pulse triggering, photodiode activation triggering, etc.). This approach enables digital signal processing solutions in order to detect systematic and non-systematic error sources which can then be compensated.

The analog core 31 is configured to generate and output measured zero-crossing times ZCmeas of the MEMS mirror 12, which is received by the phase error detector 32. The analog core 31 is further configured to provide direction information DL1L and DL1R related to the direction of rotation (e.g., clockwise or counter-clockwise) of the MEMS mirror 12 to the direction signal generator 37, which is configured to generate a direction signal d(n) (e.g., +1 or −1) based on the direction information DL1L and DL1R.

The phase error detector 32 is configured to receive the measured zero-crossing times ZCmeas from the analog core 31 and reference zero-crossing times ZCref from the mirror driver 36. The reference zero-crossing times ZCref are expected zero-crossing times of the MEMS mirror 12 based on the oscillation frequency of the mirror. The reference zero-crossing times ZCref are generated by the mirror driver 36 (i.e., by the PLL).

The phase error detector 32 includes comparator circuitry (e.g., a phase detector) that is configured to compare the measured (actual) zero-crossing times ZCmeas and the reference zero-crossing times ZCref, and output a difference thereof. In particular, the difference is a value representative of number of clock cycles that are between ZCmeas and ZCref. Thus, the phase error detector is configured to compare the measured zero-crossing timing with an expected zero-crossing timing, and generate a phase error signal p(n) representative of the difference between the measured zero-crossing timing and the expected zero-crossing timing. In other words, the phase error signal p(n) represents the phase error between the measured zero-crossing times ZCmeas and the reference zero-crossing times ZCref. The phase error signal p(n) is actively output for each detected zero-crossing of the MEMS mirror 12.

For example, the phase error signal p(n) will be zero if the measured zero-crossing time ZCmeas and expected zero-crossing time ZCref are equal. Otherwise, the phase error signal will be a non-zero value corresponding to the difference between the measured zero-crossing time and expected zero-crossing time.

In addition, the phase error signal p(n) is generated for both rotation directions of the mirror. For example, in the case that asymmetry exists, the phase error detector 32 may generate a phase error signal p(n) having a value of +3 corresponding to a first rotation direction, and may generate a phase error signal p(n) having a value of −3 corresponding to a second rotation direction. As long as the values are not equal for the two rotation directions, asymmetry exists.

Each pass of the MEMS mirror (i.e., from left-to-right or right-to-left) generates a value for the phase error signal p(n). In particular, any time the MEMS mirror 12 rotates past the zero-crossing, a timing of the zero-crossing is measured, and a phase error signal p(n) is generated based thereon in comparison to the expected zero-crossing time. Thus, a PLL error spectrum represents the output of the phase detector over time (i.e., the phase error signal over time).

The zero-crossing time deviations in the first rotation direction may differ from the zero-crossing time deviations in the second rotation direction. Thus, the phase error signal p(n) for a zero-crossing time in the first rotation direction may be different than the phase error signal p(n) for a zero-crossing time in the second rotation direction. This asymmetry in zero-crossing timings results in a periodic jitter component in the PLL error spectrum. Due to this asymmetry in zero-crossing timings, at least a portion of the error budget needed to comply with accuracy requirements may be consumed. Therefore, it is desired to remove this error from the output of the phase error detector 32 so that the error is not introduced into the position information of the MEMS mirror 12.

In addition, a chopping is a technique used to compensate for the analog offsets of operational amplifiers used in the analog core 31 of LIDAR system. However, this chopping technique may also introduce periodic errors into the PLL error spectrum generated by the phase error detector. These periodic jitter components, also referred to as chopping errors, should also be removed from the output of the phase error detector 32 to improve the accuracy of the position information of the MEMS mirror 12.

Both the errors caused by the asymmetry of the mirror and by the chopping are introduced into the PLL error spectrum on a periodic basis as periodic jitter.

The error detection and compensation unit 33 is configured to receive the phase error signal p(n) from the phase error detector 32, detect the periodic jitter components, remove the periodic jitter components from the phase error signal p(n) in order to generate a compensated phase error signal pcorr(n). The error detection and compensation unit 33 also receives the direction signal d(n) from the direction signal generator 37.

The compensated phase error signal pcorr(n) effectively reduces the jitter of the PLL, which enables higher precision in sensing and controlling the MEMS mirror 12 as well as enables higher precision in controlling the illumination unit 10. Specifically, removing the periodic jitter components from the phase error signal p(n) enables more accurate mirror position signaling (i.e., mirror position information), which enables more accurate laser shooting and more accurate controlling of the mirror.

The error detection and compensation unit 33 includes a DSP structure made of circuitry logic (e.g., adders, subtractors, multipliers, integrators, dividers, and the like) coupled to form a signal processing chain that is configured to detect and compensate periodic jitter components. In particular, the DSP structure is configured to measure and compensate the two prominent error sources of mirror asymmetry and chopping induced periodic jitter.

The corrected phase detector signal pcorr(n) is used to derive the signal $f_{DCO}$ of the DCO 35 and forms a basis for the mirror position information generated by the mirror driver 36. In particular, the error detection and compensation unit 33 outputs the corrected phase detector signal pcorr(n) to the loop filter 34, which implements either proportional-integral (PI) or proportional-integral-derivative (PID) control to increment a DCO counter 35a of the DCO 35. The DCO counter 35a is responsible for actuation frequency of the mirror 12. Thus, the loop filter 34 generates/adjusts a DCO increment output thereby to the DCO counter 35a, which adjusts a DCO counter value, and the DCO 35 adjusts the actuation frequency (i.e., signal $f_{DCO}$) of the MEMS mirror 12 based on the DCO counter value.

Because the periodic jitter components are absent from the corrected phase detector signal pcorr(n), the phase of signal $f_{DCO}$ of the DCO 35 is not influenced by these jitter components and more accurately corresponds to the phase of the MEMS mirror 12. The DCO 35 provides the signal $f_{DCO}$ to the mirror driver 36 based on the value of the DCO counter 35a.

The mirror driver 36 is a mirror scheduler that determines a mirror subtiming of the MEMS mirror 12 based on the signal $f_{DCO}$. Thus, the mirror driver 36 includes at least one processor for performing timing analysis and scheduling, shown as a mirror subtiming controller 36a, which further includes a subtiming counter 36b. The subtiming counter 36b keeps track of expected zero-crossing times and resets to a zero-crossing counter value (e.g., 0x0000) to coincide with a time a zero-crossing event is expected and is responsible for the mirror phase (i.e., where the mirror position is). The zero-crossing counter value may be referred to an event-crossing counter value to cover zero and non-zero crossing events.

Based on the subtiming counter 36b, the mirror subtiming controller 36a is configured to generate a driving voltage HV as a control signal to control the oscillation of the MEMS mirror 12. More specifically, the driving voltage HV (e.g., 100V) is toggled on and off, and is applied to the actuator structure of the MEMS mirror 12 as previously described above. The mirror driver 36 is not only configured to switch the driving voltage HV on and off, but may also drive the voltage to any level (e.g., full on, half-full off, etc.).

The mirror driver 36 determines mirror position information based on the signal $f_{DCO}$, and outputs the mirror position information to the system controller 23. The mirror position information actively indicates a position of the MEMS mirror 12. The system controller 23 may use the mirror position information to control the timing of the laser pulses of the illumination unit 10. The mirror position information may also be used to control the activation timing of the diodes of the photodetector array 15.

The mirror driver 36 may also determine the expected zero-crossing times ZCref based on the mirror position information.

The system controller 23 may also be used to configure the mirror driver 36 with certain parameters (e.g., during startup).

In addition to removing the periodic jitter components, the MEMS driver ASIC 25 is configured to detect disturbance events, such as large mechanical shocks or mechanical vibrations, that disrupt the resonance of the MEMS mirror 12 and the PLL is no longer able to maintain the correct phase and frequency of the mirror. The MEMS driver ASIC 25 is further configured to correct the phase and the frequency of the MEMS mirror 12 following a detection of such a disturbance event. This correction of the phase and the frequency, and the recovery of the operation of MEMS mirror 12 as a whole, is performed during runtime of the MEMS mirror 12 (i.e., while maintaining operation of the MEMS mirror 12) without stopping the MEMS mirror 12.

As a first step, the phase error detector 32 includes a disturbance event detector 32a that performs, for example, shock detection. In particular, the disturbance event detector 32a compares the absolute value of the phase error signal p(n) to a disturbance threshold value, and detects whether the absolute value of the phase error signal p(n) is greater than the disturbance threshold value. As an example, the disturbance threshold value may be 200 clock cycles, but is not limited thereto.

If the absolute value of the phase error signal p(n) is greater than the disturbance threshold value, the disturbance event detector 32a detects a disturbance event. If the absolute value of the phase error signal p(n) is not greater than the disturbance threshold value, then no disturbance event is detected, and the MEMS driver ASIC operates 25 as described above. Essentially, the disturbance event detector 32a detects whether or not a zero-crossing time ZCmeas deviates too greatly from a reference zero-crossing time ZCref such that recovery of the operation of the MEMS mirror 12 is warranted.

In response to detecting a disturbance event, the disturbance event detector 32a is configured to generate a correction enable signal CorrEn and a high voltage enable signal HVEn. The disturbance event detector 32a is also configured to disable the phase detector of the phase error detector 32, for example, while the correction enable signal CorrEn and the high voltage enable signal HVEn are enabled, in response to detecting a disturbance event.

The correction enable signal CorrEn is configured to enable the PFD and correction circuit 38. Thus, the PFD and correction circuit 38 is inactive until a disturbance event occurs. Immediately after the disturbance event occurs, the PFD and correction circuit 38 is activated and turned on. In response to being activated, the PFD and correction circuit 38 is configured to disable the phase error detector 32. In particular, in response to receiving the correction enable signal CorrEn, the PFD and correction circuit 38 generates a control signal SwitchEn to open the switch SW1.

With the switch SW1 being open or disabled, the loop filter 34 is disconnected from the DCO 35 such that the DCO no longer receives a DCO increment from the loop filter 34, and thereby effectively disables the output of the phase error detector 32 and the control loop of the PLL. Thus, switch SW1 is disabled after a disturbance event is detected and will be re-enabled via the control signal SwitchEn after the mirror frequency and mirror phase are corrected by the PFD and correction circuit 38.

The high voltage enable signal HVEn is configured to instruct the mirror driver 36 to turn on the high voltage, which in turn sends an HV On command to the analog core 31. In particular, the mirror driver 36 includes a shock HV (On/Off) controller 36a that is configured to receive the high voltage enable signal HVEn. The high voltage enable signal HVEn triggers the shock HV (On/Off) controller 36c to turn on the driving voltage HV for a predetermined duration of at least two mirror periods. As a result, the shock HV (On/Off) controller 36c overrides the normal sub-timing operation of the mirror driver 36 so that correction of the MEMS mirror 12 can be performed.

The driving voltage HV is turned on because it is only possible to measure a zero-crossing event while the driving voltage HV is on. In order to fully recover the operation of the MEMS mirror 12, at least three consecutive zero-crossing events are to be detected. Thus, the predetermined duration should be long enough to detect three consecutive zero-crossing events. Typically, a duration of two mirror periods ensures that at least three consecutive zero-crossing events can be detected.

In view of the above, in response to detecting a disturbance event, the disturbance event detector 32a disables the phase error detector 32, enables the PFD and correction circuit 38, and turns on the driving voltage HV.

The PFD and correction circuit 38 is configured to receive the measured zero-crossing time ZCmeas from the analog core 31 in order to detect zero-crossing events. Using detected zero-crossing events, the PFD and correction circuit 38 is configured to detect a current phase and frequency of the MEMS mirror 12 after a disturbance event and calculate a new frequency DCO increment.

In particular, the PFD and correction circuit 38 includes a PFD, which includes a Zero Crossing Timing Counter (ZCTC), and a correction circuit that generates compensation signals based on calculations that use the measurements taken by the PFD. The compensation signals include a corrected DCO increment signal (DCOcorr) and a corrected phase counter signal (PCcorr). The corrected DCO increment signal (DCOcorr) provides a corrected DCO increment, whereas the corrected phase counter signal (PCcorr) provides a corrected phase counter value (e.g., 0x0000) to the subtiming counter 36b. Alternatively, the corrected phase counter signal (PCcorr) may trigger the subtiming counter 36b to reset to the zero-crossing counter value (e.g., 0x0000) without explicitly providing the corrected phase counter value. In either case, the subtiming counter 36b resets to the zero-crossing counter value. In response to receiving the corrected phase counter value, the subtiming counter 36b is reset to the corrected phase counter value.

During the predetermined duration during which the PFD and correction circuit 38 is enabled, the PFD is configured to detect zero-crossing events of the mirror 12. The PFD and correction circuit 38 determines the mirror frequency and the mirror phase of the mirror during the predetermined duration using these detected zero-crossing events.

In order to determine the mirror frequency, the PFD waits for the first zero-crossing event following the occurrence of the disturbance event. Once the PFD detects the first zero-crossing event, the PFD starts the ZCTC, which counts up to a second zero-crossing event following the detection of the disturbance event. It is noted that a period between the first zero-crossing event and the second zero-crossing event represents one half mirror period of the mirror 12 and a period between the first zero-crossing event and the third zero-crossing event represents one full mirror period of the mirror 12.

The correction circuit of the PFD and correction circuit 38 uses the counter value of the ZCTC, coinciding with the second zero-crossing event and representative of a time period between the first and the second zero-crossing events, to determine the mirror frequency of the mirror 12 at that moment. More specifically, the counter value of the ZCTC represents one half of a full mirror period and is used by the correction circuit to calculate a corrected DCO counter increment DCOcorr. The corrected DCO counter increment DCOcorr is representative of an actuation frequency of the mirror (i.e., a frequency of the HV on/off signal).

The correction circuit of the PFD and correction circuit 38 stores a DCO counter maximum (DCOmax) of the DCO counter 35a and a subtiming counter range of the subtiming counter 36b, and uses these values, along with the counter value of the ZCTC, to calculate the corrected DCO counter increment DCOcorr based on the following equation (1):

$$DCOcorr = DCO\,max \cdot Subtiming\ range / ZCTC \quad (1)$$

According to equation (1), the DCO counter maximum DCOmax is multiplied by the subtiming counter range, and the product is divided by the counter value of the ZCTC to obtain the corrected DCO counter increment DCOcorr.

Next, the PFD and correction circuit 38 is configured to wait until the third zero-crossing event following the occurrence of the disturbance event is detected to set the mirror frequency and the mirror phase. In particular, at the occurrence of the third zero-crossing event, the PFD and correction circuit 38 is configured to set the mirror frequency by outputting the corrected DCO counter increment DCOcorr to the DCO counter 35a. Thus, the DCOcorr signal sets the DCO counter increment. The DCO counter value is composed of the previous DCO counter value plus the DCO increment.

In addition, at the occurrence of the third zero-crossing event, the PFD and correction circuit 38 is configured to set the mirror phase by resetting the subtiming counter value of the subtiming counter 36b to its a zero-crossing counter value (e.g., to 0x0000).

While the PFD and correction circuit 38 calculates the DCO counter increment DCOcorr in response to the second zero-crossing event, waiting until the third zero-crossing event to set the mirror frequency and the mirror phase ensures that the PFD and correction circuit 38 has sufficient processing time to complete the calculation of the corrected DCO counter increment DCOcorr. Thus, waiting until the third zero-crossing event guarantees that the mirror frequency and the mirror phase are set at the same time.

In addition, at the occurrence of the third zero-crossing event, the PFD and correction circuit 38 is configured to close or enable switches SW2 and SW3 via another control signal SwitchEN so that the corrected signals DCOcorr and PCcorr can be transmitted to the DCO 35 and the mirror driver 36, respectively. Once the corrected signals DCOcorr and PCcorr are output from the PFD and correction circuit 38, the PFD and correction circuit 38 disables switches SW2 and SW3, re-enables switch SW1 in order to resume normal operation, and goes inactive until the next correction enable signal CorrEn is received.

Figure 4:
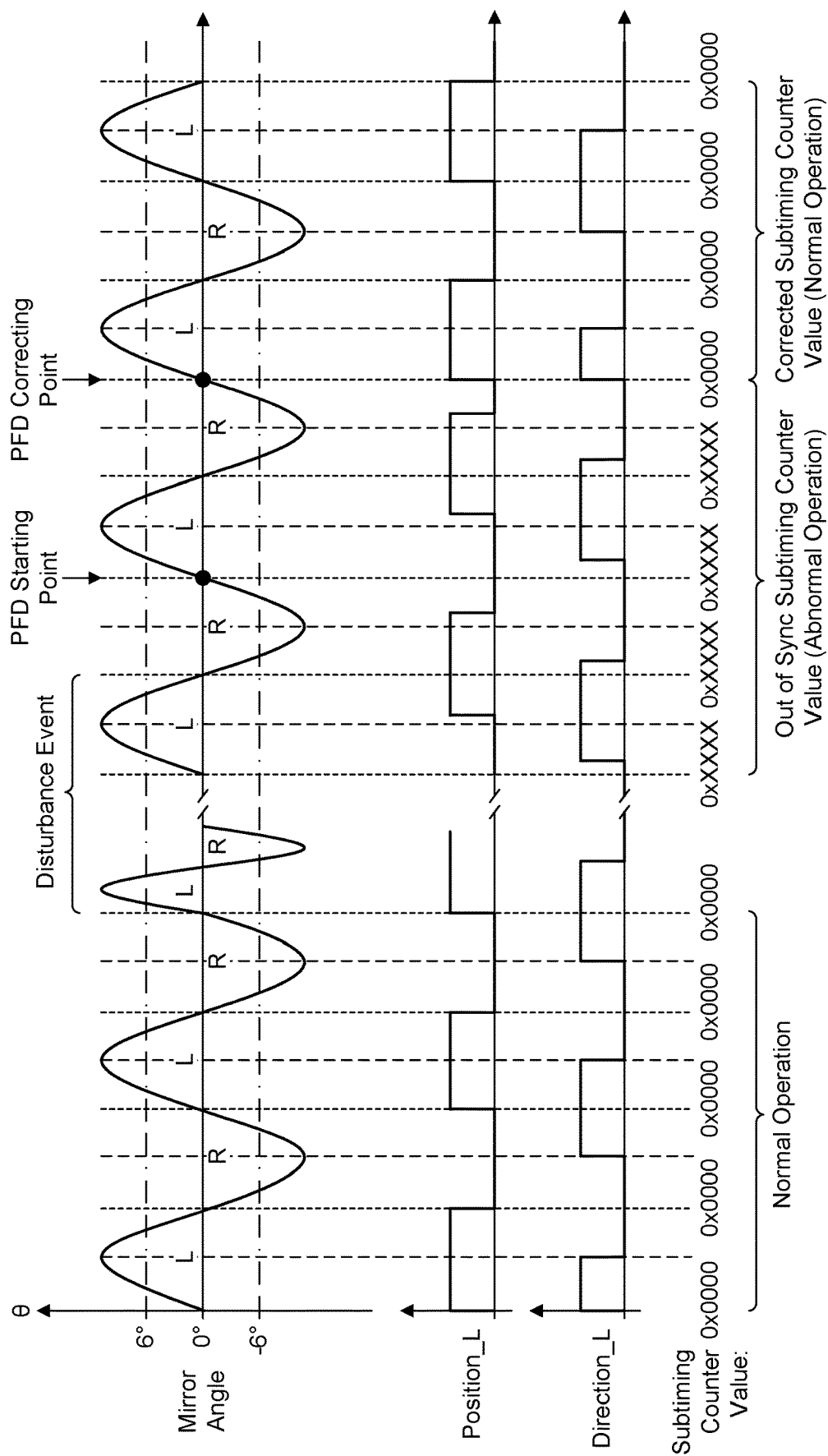
FIG. 4 illustrates a signal diagram corresponding to a MEMS oscillation structure according to one or more embodiments.

The DCO 35 includes a DCO counter 35a and a value of the DCO counter represents the mirror actuation frequency. In addition, the mirror driver 36 includes a subtiming counter 36b that represents the phase of the mirror. The driving voltage HV is turned on and off based on the subtiming counter values. FIG. 4 illustrates a signal diagram of a mirror angle of the mirror, a left position signal Position_L that indicates when the mirror is tilted to the left, as opposed to being tilted to the right, and a direction signal Direction_L that indicates when the mirror is moving is the left direction (e.g., rotating in a counter-clockwise direction), as opposed to oscillating in the right direction (e.g., rotating in a clockwise direction).

In addition, FIG. 4 illustrates an example of subtiming values of the mirror driver's 36 subtiming counter 36b. Here, it is shown that the subtiming counter is reset to a zero-crossing counter value (e.g., 0x0000) at every zero-crossing and counts up until the next zero-crossing. The subtiming counter is synchronized with the zero-crossings such that the subtiming counter starts at 0x0000 and counts up to 0x3FFF, after which it resets to 0x000 and counts up again. After a disturbance event there is a shift in mirror phase and frequency. As a result, the zero-crossings are no longer occurs in synchronization with 0x0000, but may instead occur at any value between 0x0000 and 0x3FFF, indicated in the figure by 0xXXXX. After compensation is performed by the PFD and correction circuit 38, the subtiming counter is corrected, and normal operation of the mirror is resumed without stopping the mirror and starting the mirror anew. Thus, the mirror frequency and phase is corrected during while operating the mirror and the zero-crossings are again synchronized with the subtiming counter value 0x0000.

The signal diagram of FIG. 4 also shows a point at which the disturbance event occurs, a PFD starting point corresponding to the first zero-crossing event following the occurrence of the disturbance event, and a PFD correcting point corresponding to the third zero-crossing event following the occurrence of the disturbance event.

Figure 5:
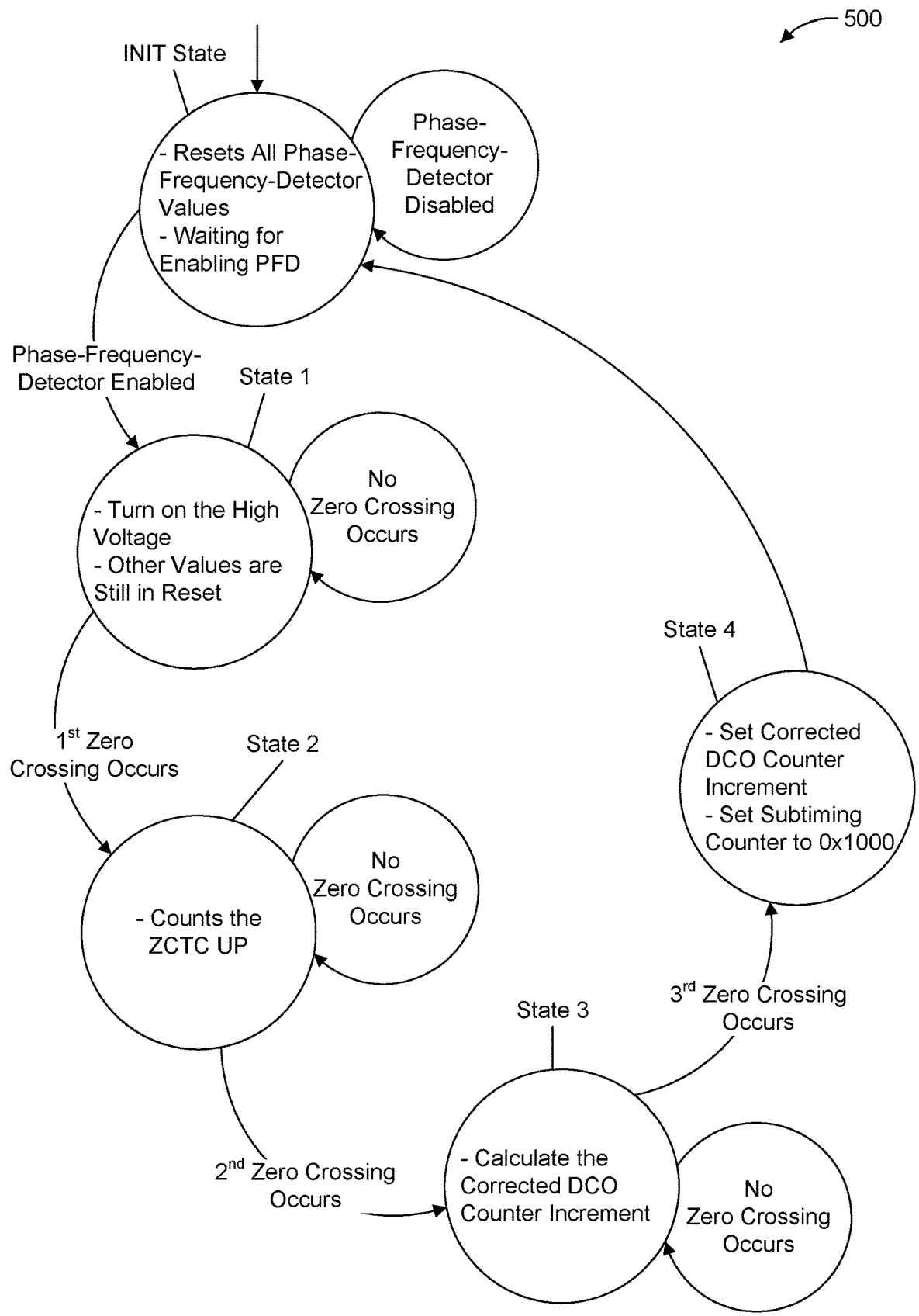
FIG. 5 shows a state diagram of a phase frequency detector and correction circuit of a disturbance detection and correction system according to one or more embodiments.

FIG. 5 is a state diagram 500 of the PFD and correction circuit 38 according to one or more embodiments. In particular, the state diagram 500 includes an Initial (INIT) State during which all values at the PFD and correction circuit 38, including the ZCTC, are reset and the PFD and correction circuit 38 waits for the correction enable signal CorrEn (i.e., the PFD and correction circuit 38 wait for a disturbance event that is being monitored by the disturbance event detector 32a). Upon receiving the correction enable signal CorrEn, the PFD and correction circuit 38 is enabled and enters into State 1.

During State 1, the PFD and correction circuit 38 transmits the enable signal HVEn, transmits the control signal SwitchEn, and monitors for a first zero-crossing event. State 1 continues until the first zero-crossing event is detected by the PFD and correction circuit 38, at which time the PFD and correction circuit 38 enters into State 2.

During State 2, the ZCTC counts up while the PFD and correction circuit 38 monitors for the second zero-crossing event. State 2 continues until the second zero-crossing event is detected by the PFD and correction circuit 38, at which time the PFD and correction circuit 38 stops the ZCTC counter and enters into State 3.

During State 3, the PFD and correction circuit 38 using the counter value of the ZCTC to calculate the DCO counter increment DCOcorr and monitors for the third zero-crossing event. State 3 continues until the third zero-crossing event is detected by the PFD and correction circuit 38, at which time the PFD and correction circuit 38 enters into State 4.

During State 4, switches SW2 and SW3 are enabled and the corrected signals DCOcorr and PCcorr are generated and transmitted. After transmitting the corrected signals DCOcorr and PCcorr, the PFD and correction circuit 38 returns to the INIT State, at which time the switches SW2 and SW3 are disabled, switch SW1 is reenabled, and all values at the PFD and correction circuit 38 are reset for the next disturbance event.

Although embodiments described herein relate to a MEMS device with a mirror, it is to be understood that other implementations may include optical devices other than MEMS mirror devices or other MEMS oscillating structures. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Depending on certain implementation requirements, embodiments provided herein can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structures or any other structure suitable for implementation of the techniques described herein. In addition, in some aspects, the functionality described herein may be provided within dedicated hardware and/or software modules. Also, the techniques could be fully implemented in one or more circuits or logic elements.

The above described exemplary embodiments are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A system for driving a microelectromechanical system (MEMS) oscillating structure, comprising:
the MEMS oscillating structure configured to oscillate about a rotation axis; and
a phase frequency detector (PFD) and correction circuit configured to monitor for a plurality of measured crossing events of the MEMS oscillating structure oscillating about the rotation axis, generate a first compensation signal based on at least a first measured crossing event and a second measured crossing event of the plurality of measured crossing events to correct a frequency of the MEMS oscillating structure, and generate a second compensation signal based on a third measured crossing event of the plurality of measured crossing events to correct a phase of the MEMS oscillating structure.

2. The system of claim 1, wherein:
the first measured crossing event, the second measured crossing event, and the third measured crossing event occur sequentially as the MEMS oscillating structure oscillates about the rotation axis after a disturbance event, wherein the second measured crossing event is subsequent to the first measured crossing event, and the third measured crossing event is subsequent to the second measured crossing event.

3. The system of claim 1, wherein a first time difference between the first measured crossing event and the second measured crossing event is representative of a half oscillation period of the MEMS oscillating structure and a second time difference between the first measured crossing event and the third measured crossing event is representative of a full oscillation period of the MEMS oscillating structure.

4. The system of claim 1, wherein:
the first compensation signal includes a corrected digitally controlled oscillator (DCO) counter increment, and
the PFD and correction circuit is configured to determine a time period between the first measured crossing event and the second measured crossing event, and calculate the corrected DCO counter increment based on the time period.

5. The system of claim 4, further comprising:
a DCO counter configured to receive the first compensation signal and update a DCO counter value used to set the frequency of the MEMS oscillating structure based on the corrected DCO counter increment.

6. The system of claim 4, wherein:
the second compensation signal is a corrected phase counter signal configured to reset a subtiming counter to an event-crossing counter value, wherein the subtiming counter is used to drive the MEMS oscillating structure about the rotation axis, and
the PFD and correction circuit is configured to transmit the first compensation signal and the second compensation signal based on detecting the third measured crossing event.

7. The system of claim 6, wherein:
the first measured crossing event, the second measured crossing event, and the third measured crossing event are zero-crossing events at which a rotation angle of the MEMS oscillating structure is 0° as the MEMS oscillating structure oscillates about the rotation axis.

8. The system of claim 1, wherein:
the second compensation signal is a corrected phase counter signal configured to reset a subtiming counter to an event-crossing counter value, wherein the subtiming counter is used to drive the MEMS oscillating structure about the rotation axis, and
the PFD and correction circuit is configured to transmit the second compensation signal based on detecting the third measured crossing event.

9. The system of claim 8, further comprising:
a driver configured to drive the MEMS oscillating structure about the rotation axis, the driver comprising the subtiming counter configured to control the phase of the MEMS oscillating structure.

10. The system of claim 1, further comprising:
a driver configured to toggle a driving voltage on and off to drive the MEMS oscillating structure about the rotation axis,
wherein, based on a disturbance event, the PFD and correction circuit is configured to control the driver to maintain the driving voltage on for at least two oscillation periods of the MEMS oscillating structure.

11. The system of claim 10, wherein the PFD and correction circuit is configured to monitor for the plurality of measured crossing events while the driver maintains the driving voltage on for the at least two oscillation periods.

12. A method of compensating a microelectromechanical system (MEMS) oscillating structure, the method comprising:
driving the MEMS oscillating structure configured to oscillate about a rotation axis;
detecting a disturbance event that disrupts an oscillation of the MEMS oscillating structure; and
based on the disturbance event:
monitoring for a plurality of measured crossing events of the MEMS oscillating structure oscillating about the rotation axis;
generating a first compensation signal based on at least a first measured crossing event and a second measured crossing event of the plurality of measured crossing events to correct a frequency of the MEMS oscillating structure; and
generating a second compensation signal based on a third measured crossing event of the plurality of measured crossing events to correct a phase of the MEMS oscillating structure.

13. A system for driving a microelectromechanical system (MEMS) oscillating structure, comprising:
the MEMS oscillating structure configured to oscillate about a rotation axis;
a disturbance event detector configured to detect a disturbance event that disrupts an oscillation of the MEMS oscillating structure; and
a phase frequency detector (PFD) and correction circuit configured to, based on the disturbance event, monitor for a plurality of measured crossing events of the MEMS oscillating structure oscillating about the rotation axis, generate a first compensation signal based on at least a first measured crossing event and a second measured crossing event of the plurality of measured crossing events to correct a frequency of the MEMS oscillating structure, and generate a second compensation signal based on a third measured crossing event of the plurality of measured crossing events to correct a phase of the MEMS oscillating structure.

14. The system of claim 13, wherein the disturbance event is caused by vibration that is transferred to the MEMS oscillating structure.

15. The system of claim 13, wherein the disturbance event is a mechanical shock.

16. The system of claim 13, further comprising:
a driver configured to toggle a driving voltage on and off to drive the MEMS oscillating structure about the rotation axis,
wherein, based on the disturbance event, the PFD and correction circuit is configured to control the driver to maintain the driving voltage on for at least two oscillation periods of the MEMS oscillating structure.

17. The system of claim 13, wherein:
the first measured crossing event, the second measured crossing event, and the third measured crossing event occur sequentially as the MEMS oscillating structure oscillates about the rotation axis after the disturbance event, wherein the second measured crossing event is subsequent to the first measured crossing event, and the third measured crossing event is subsequent to the second measured crossing event.

18. The system of claim 13, wherein a first time difference between the first measured crossing event and the second measured crossing event is representative of a half oscillation period of the MEMS oscillating structure and a second time difference between the first measured crossing event and the third measured crossing event is representative of a full oscillation period of the MEMS oscillating structure.

19. The system of claim 13, wherein:
the disturbance event detector is configured to detect the disturbance event based on a phase error signal and a disturbance threshold value, wherein the disturbance event disrupts the oscillation of the MEMS oscillating structure such that the phase error signal exceeds the disturbance threshold value,
based on the disturbance event, the PFD and correction circuit is configured to disable a signal path corresponding to the phase error signal until at least the third measured crossing event, and
based on the third measured crossing event, the PFD and correction circuit is configured enable the signal path corresponding to the phase error signal.

* * * * *